United States Patent [19]
Horikawa et al.

[11] Patent Number: 5,965,302
[45] Date of Patent: Oct. 12, 1999

[54] METHOD FOR PRODUCING MASK ROM AND PHOTOMASK USED THEREFOR

[75] Inventors: Yoshiyuki Horikawa; Kenji Shimizu, both of Kasaoka, Japan

[73] Assignee: Sharp Kabushiki Kaisha, Osaka, Japan

[21] Appl. No.: 09/020,423

[22] Filed: Feb. 9, 1998

[30] Foreign Application Priority Data

Mar. 13, 1997 [JP] Japan ..................................... 9-059676

[51] Int. Cl.⁶ ..................................................... G03F 9/00
[52] U.S. Cl. .................................................................. 430/5
[58] Field of Search ............................... 430/5, 311, 312, 430/322

[56] References Cited

U.S. PATENT DOCUMENTS 5,370,975  12/1994  Nakatani ..................................... 430/5
5,650,250   7/1997  Moon ......................................... 430/5

FOREIGN PATENT DOCUMENTS 7-147334   6/1995  Japan .

*Primary Examiner*—S. Rosasco
*Attorney, Agent, or Firm*—Nixon & Vanderhye P.C.

[57] ABSTRACT

According to the present invention, a photomask for providing a pattern to a resist applied on a substrate is provided. The photomask includes a light blocking region forming a boundary between a first region and a second region on the substrate. A width of the light blocking region is such that the light blocking region is not projected on the resist.

12 Claims, 9 Drawing Sheets

METHOD FOR PRODUCING MASK ROM AND PHOTOMASK USED THEREFOR

BACKGROUND OF THE INVENTION

1. Field of the Invention

The present invention relates to a method for producing a mask ROM and a photomask used for such a method.

2. Description of the Related Art

A mask ROM of the type to which the present invention relates is a semiconductor memory, on which data is written by placing a resist over a plurality of memory cells arranged in a matrix, exposing the resist to light via a photomask so as to pattern the resist, and then selectively processing the memory cells. The mask ROM may, in some cases, form a part of a semiconductor device.

FIG. 10 illustrates an example of a photomask, where the white portions block light while the black (hatched) portions transmit light. In this photomask, memory cell regions 101 respectively correspond to the memory cells of the mask ROM while slits 102 correspond to boundaries between the memory cells.

Each of the memory cell regions 101 is slightly smaller than a memory cell of the mask ROM and is formed to occupy the inside of the memory cell and to form the slits 102 between the memory cell regions 101. Such an arrangement prevents light, which is supposed to be transmitted through the memory cell region 101 and to irradiate a portion of the resist over the corresponding memory cell, from leaking to and influencing the adjacent memory cells.

For example, in the case where data is written by selecting memory cells with a resist pattern and implanting an impurity into the selected memory cells, if light leaks out of the selected memory cells to adjacent memory cells, thereby disordering the resist pattern, the impurity may diffuse out of the selected memory cells into the adjacent memory cells. In such a case, an error occurs in the data to be written, thereby leading to performance abnormality of the mask ROM and lowering the production yield thereof.

For example, when the length of a side of the memory cell region 101 is about 0.8 to 0.9 $\mu$m, the width of the slit 102 is set to about 0.4 $\mu$m, so as to avoid the influence of light leaking to adjacent memory cells.

However, light leaking out of the memory cell region 101 consequently reduces the width of a linear portion of the resist pattern corresponding to the slit 102. In such a case, the linear portion may be collapsed or stripped off. The collapsed or stripped linear portion leads to circuit defects. This problem is more prominent when the slits 102 are provided in a parallel stripe pattern than when provided in a matrix as illustrated in FIG. 10.

On the other hand, when the width of the slit 102 is increased in order to avoid the above-described problem, the total area of the slits 102 increases. This makes it difficult to increase the density of memory cells and to downsize a mask ROM, thereby increasing the production cost thereof.

In view of this, an arrangement such as that illustrated in FIG. 11 has been proposed (see Japanese Laid-Open Publication No. 6-13250). In this arrangement, memory cell regions 111 for transmitting light are connected to one another so as to eliminate the slits between the memory cell regions 111, while memory cell regions 112 for blocking light are connected together so as to eliminate slits between the memory cell regions 112.

However, when a resist pattern illustrated in FIG. 12 is formed by using the photomask illustrated in FIG. 11, the four corners of each covering portion 113 and 113' of the resist pattern corresponding to the light blocking portions 112 and 112' of the photomask will be rounded off due to the optical diffraction occurring at the four corners of the light blocking portions 112 and 112' of the photomask. In such a case, light may leak to and influence the memory cells under the covering portions 113 and 113', thereby generating data errors.

In an attempt to prevent the corners of the resist pattern from being blunt and rounded off, another arrangement has been proposed (see Japanese Laid-Open Publication No. 7-147334). In this case, as illustrated in FIG. 13, an auxiliary pattern 123 is provided at each corner of a light transmitting portion 122 formed of light transmitting memory cell regions 121.

However, when such an auxiliary pattern 123 is used, the amount of information required to represent a photomask pattern increases because the pattern is then defined by smaller units, whereby the number of addresses designating the units increases. This significantly increases the data processing time. Moreover, it will also require fine processing of the resist, making the production thereof difficult, and thereby increasing the cost of a photomask as well as the cost of a mask ROM.

Moreover, although the auxiliary pattern 123 is favorable for the light transmitting portion 122, it is not favorable for a part 124 of the light blocking portions adjoining the light transmitting portion 122, and does not prevent this part 124 from being deformed. That is, such an auxiliary pattern is not appropriate for improving both the resolution of the light transmitting portions and the resolution of the light blocking portions of a photomask at once. In order to improve both of the resolutions at once, the number of types of the auxiliary pattern needs to be increased, which further complicates the photomask pattern.

SUMMARY OF THE INVENTION

According to one aspect of this invention, a photomask for providing a pattern to a resist applied on a substrate includes a light blocking region forming a boundary between a first region and a second region on the substrate. A width of the light blocking region is such that the light blocking region is not projected on the resist.

In the present invention, the light blocking slits are provided in the photomask so as to correspond to the boundaries between the memory cells, so that light leaking out of the memory cells does not reach other memory cells beyond the slits. Since the width of the slit is so small that it is not projected on the resist, portions corresponding to the slits will not appear or remain on the resist pattern, whereby a flaw or defect is not caused by the stripping of the portions of the resist pattern that correspond to the slits. Moreover, since the slit is so narrow that portions corresponding to the slits will not appear or remain on the resist pattern, it is possible to increase the density of memory cells and to downsize a mask ROM. Furthermore, the slits are each provided between the memory cell regions and define the corners of the memory cell regions, thereby functioning to improve the shape of the corners of the resist pattern that correspond to the corners of the memory cells. Thus, the corners will not be rounded off. Furthermore, since the above is realized only by narrowing the slits, it neither increases the amount of information to represent a photomask pattern nor requires fine processing. Thus, it does not increase the cost of a photomask or a mask ROM.

In one embodiment of the invention, the light blocking region includes a straight portion.

In another embodiment of the invention, the first region is a first memory cell, and the second region is a second memory cell.

In still another embodiment of the invention, a direction in which the light blocking region extends is substantially identical to a direction in which a line transmitting a signal output from at least one of the first memory cell and the second memory cell extends.

In still another embodiment of the invention, the first memory cell includes a drain, a source and a gate, while the second memory cell also includes a drain, a source and a gate, and a direction in which the light blocking region extends is substantially identical to a direction of a straight line passing through the drain of the first memory cell and the drain of the second memory cell.

In still another embodiment of the invention, the first memory cell includes a drain, a source and a gate, while the second memory cell also includes a drain, a source and a gate, and a direction in which the light blocking region extends is substantially identical to a direction of a straight line passing through the source of the first memory cell and the source of the second memory cell.

In still another embodiment of the invention, the first memory cell includes a drain, a source and a gate, while the second memory cell also includes a drain, a source and a gate, and a direction in which the light blocking region extends is substantially identical to a direction of a straight line passing through the gate of the first memory cell and the gate of the second memory cell.

In still another embodiment of the invention, a drain, a source and a gate of the first memory cell are arranged in a straight line respectively with a drain, a source and a gate of the second memory cell.

According to another aspect of this invention, a method for producing a semiconductor device includes the steps of: applying a resist on a substrate; preparing a photomask; and irradiating the resist with a beam so as to provide the resist with a pattern. The photomask includes a light blocking region forming a boundary between a first region and a second region on the substrate. A width of the light blocking region is such that the light blocking region is not projected on the resist.

According to still another aspect of this invention, a method for producing a semiconductor device includes the steps of: applying a resist on a substrate; preparing a photomask; and irradiating the resist with a beam so as to provide the resist with a pattern. In this photomask, the first region is a first memory cell, and the second region is a second memory cell.

According to still another aspect of this invention, a method for producing a mask ROM includes the steps of: applying a resist on a substrate; preparing a photomask; and irradiating the resist with a beam so as to provide the resist with a pattern. In this photomask, the first region is a first memory cell, and the second region is a second memory cell.

According to still another aspect of this invention, a method for producing a photomask for providing a pattern to a resist applied on a substrate includes the step of forming a light blocking region which forms a boundary on the substrate between a first region and a second region. A width of the light blocking region is such that the light blocking region is not projected on the resist.

Thus, the invention described herein makes possible the advantage of providing a method for producing a mask ROM and a photomask used for such a method, by a mask pattern which is simple but yet eliminates the influence of light leakage and which thus makes it possible to increase the density of the memory cells and to downsize a mask ROM.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying figures.

Figure 1:
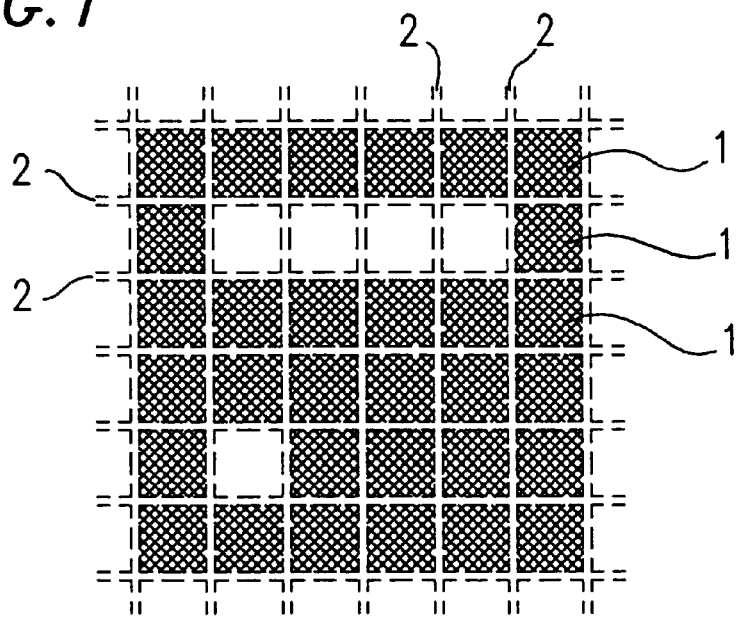
FIG. 1 is a plan view illustrating a photomask according to Example 1 of the present invention.

FIG. 1 illustrates a photomask according to Example 1 of the present invention, where the white portions block light while the black (hatched) portions transmit light. A memory cell region 1 corresponds to a memory cell of a mask ROM while a slit 2 corresponds to a boundary between the memory cells.

The memory cells of the mask ROM are arranged in matrix at a pitch of about 0.85 $\mu$m. In accordance with the memory cell arrangement, the length of a side of the memory cell region 1 is set to about 0.6 $\mu$m while the width of the slit 2 is set to about 0.25 $\mu$m. The wavelength of light used in the exposure is in the range between about 193 nm to about 450 nm.

Figure 2:
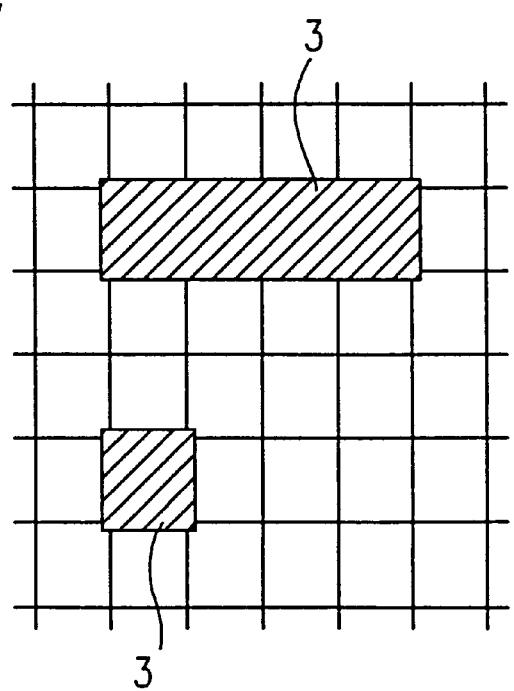
FIG. 2 is a plan view illustrating a resist pattern projected by the photomask of FIG. 1.
Figure 14:
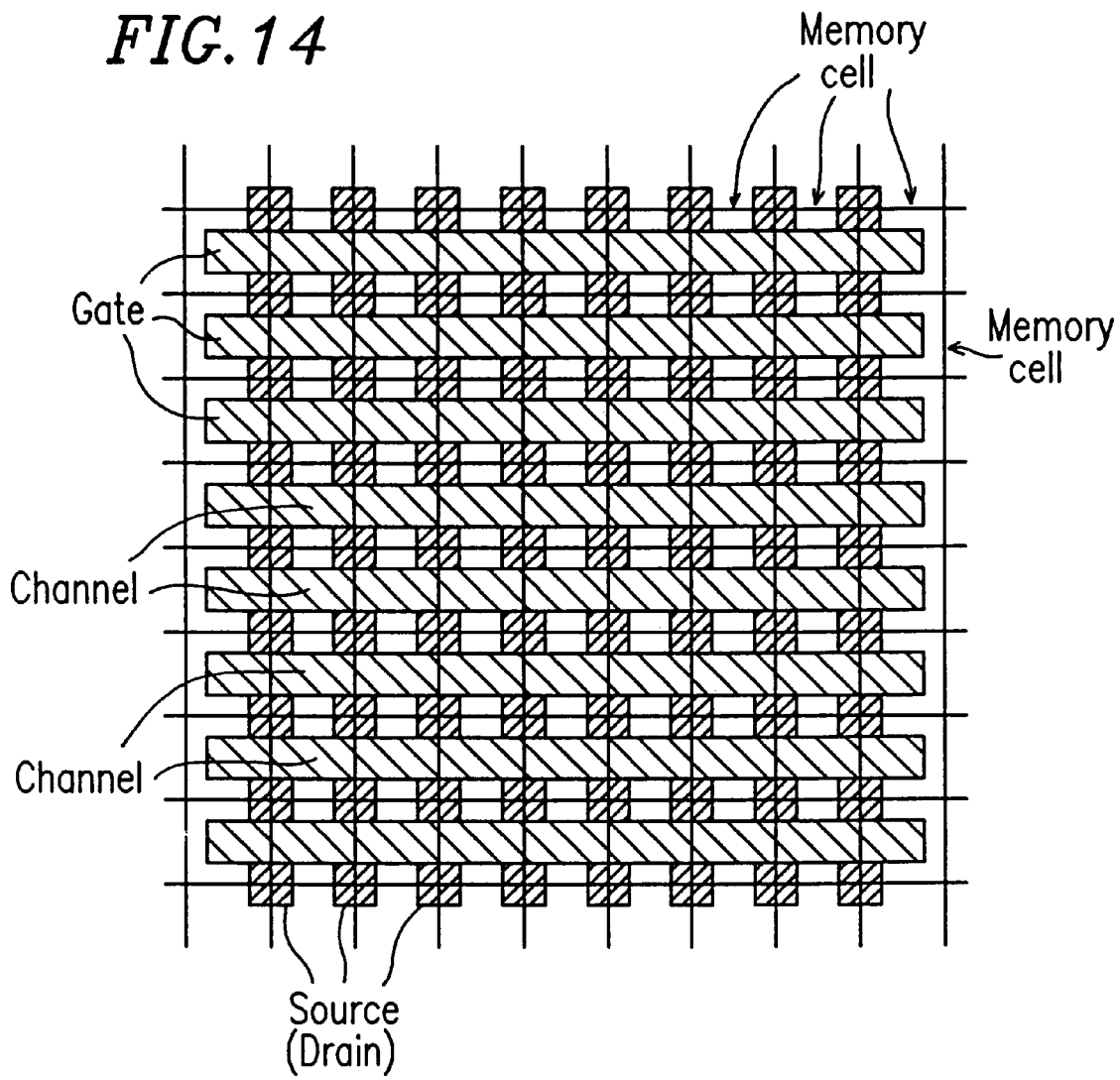
FIG. 14 illustrates memory cells according to the present invention.

The photomask of such an arrangement is used in the production of a mask ROM. That is, at the step of writing data on the memory cells after forming the memory cells, a positive-type photoresist is pre-heated and then applied to be about 1.3 μm thick on the memory cells. Then, a photomask illustrated in FIG. 1 is placed over the memory cells, and the positive-type photoresist is exposed to light via the photomask so as to project a resist pattern as illustrated in FIG. 2 on the photoresist. The size of the resist pattern 3 shown in FIG. 2 is slightly larger, by the size of the slit, than the size of the memory cell to be covered by the resist pattern. As shown in FIG. 14, each channel is formed substantially at the center of a memory cell, and has margins respectively in the upper and lower portions of the memory cell. Thus, the size of the resist pattern being slightly larger than the corresponding memory cell will not cause a problem. Then, the positive-type photoresist is developed to form a resist pattern, after which memory cells that are not under covering portions 3 are processed so that data is written thereon.

The condition for the exposure to light via the photomask is designed so that each memory cell region 1 of the photomask is projected on the resist pattern as a rectangular region having a side of about 0.6 μm long. Such a condition is likely to result in an over exposure, so that the influence of light diffracted by the slits 2 is great, whereby the slits 2 are not projected on the resist pattern.

Preferably, the width of the slit 2 is set to about ½ of the minimum width that can be projected on the resist pattern.

Thus, light which leaks out of the memory cell region 1 does not project the slit 2 on the resist pattern and the light stays within the slit 2 but does not reach adjacent memory cell regions 1, thereby not influencing the memory cells that correspond to the adjacent memory cell regions 1.

Moreover, since the slits 2 are not projected on the resist pattern, the linear portions corresponding to the slits 2 will not appear or be formed on the resist pattern, whereby a flaw or defect is not caused by the stripping of the linear portions. Furthermore, since the slit 2 is so narrow that portions corresponding to the slits 2 will not appear or remain on the resist pattern, it is possible to increase the density of memory cells and to downsize a mask ROM.

Figure 3:
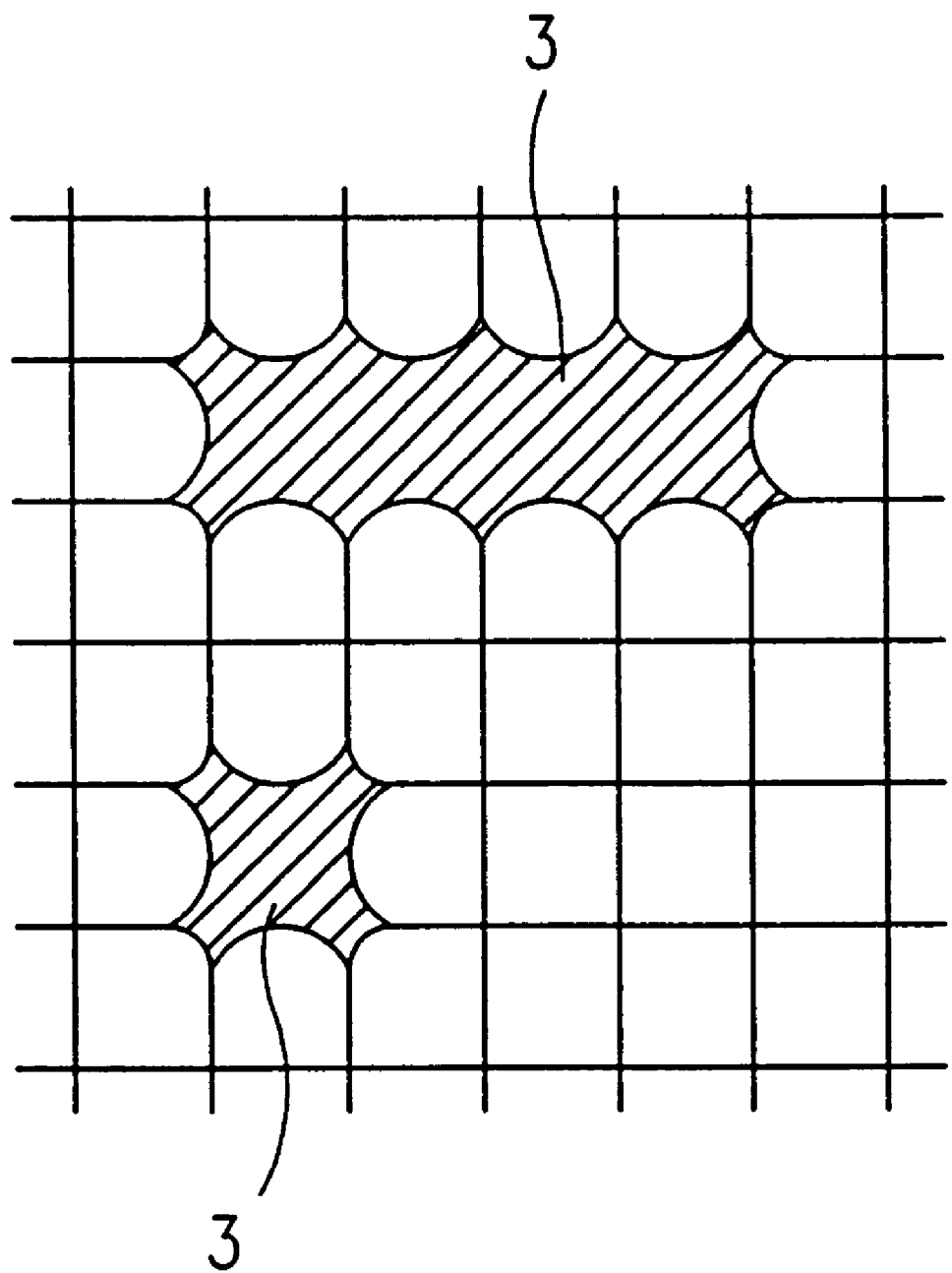
FIG. 3 illustrates the resist pattern of FIG. 2, partially in an exaggerated manner.

Moreover, the slits 2 define the corners of the memory cell regions 1, and function to amend the shape of the corners of the covering portions 3 of the resist pattern, thereby preventing the corners from being rounded off. The resist pattern illustrated in FIG. 3 represents the shape of the corners of the covering portions 3 in an exaggerated manner. It can be seen that the shape of the corner of the covering portions 3 is amended by the optical diffraction occurring at the intersection of the slits 2.

In the portions of the resist pattern to be removed that correspond to the light transmitting portions of the photomask, the slits 2 are not projected on the resist pattern, whereby the portions to be removed can be designed to be sufficiently large.

Furthermore, since the above is realized by narrowing the slits, it neither increases the amount of information to represent a photomask pattern nor requires fine processing. Thus, the cost of a photomask or a mask ROM can be kept relatively low as compared to the above-described conventional technique of adding the auxiliary pattern.

Figure 4:
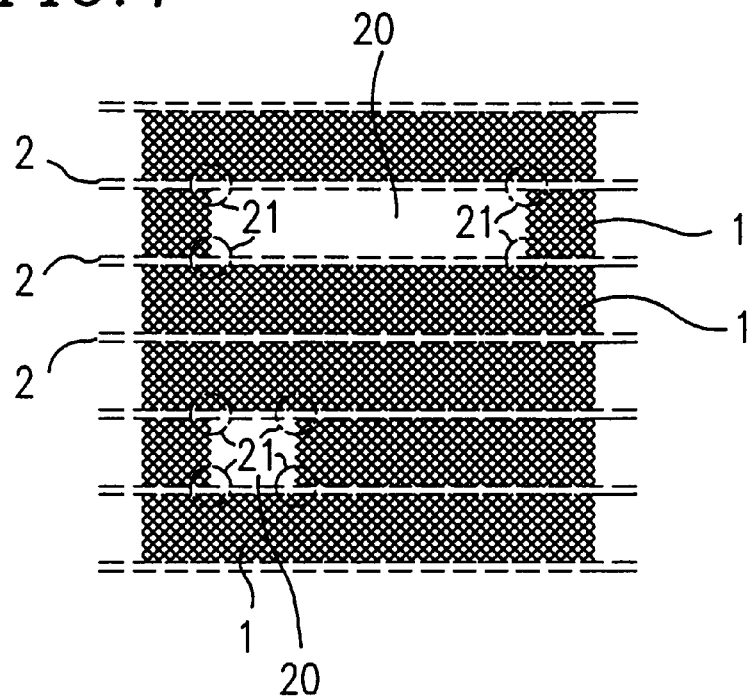
FIG. 4 is a plan view illustrating a photomask according to Example 2 of the present invention.
Figure 5:
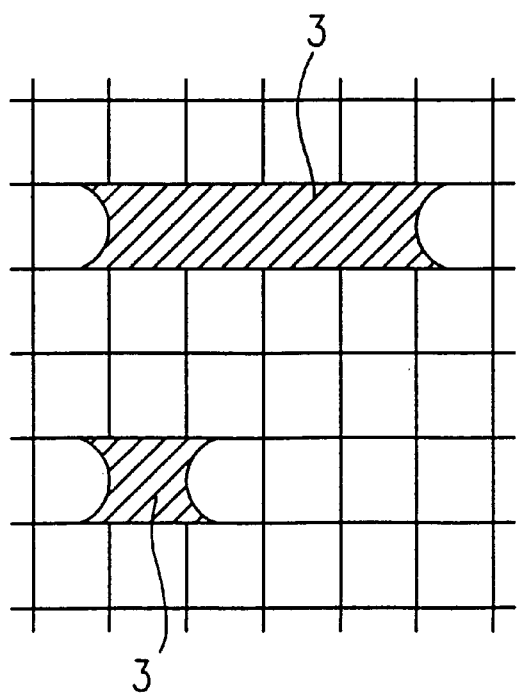
FIG. 5 is a plan view illustrating a resist pattern projected by the photomask of FIG. 4, partially in an exaggerated manner.

FIG. 4 illustrates a photomask according to Example 2 of the present invention. In Example 2, the slits 2 are provided only along the horizontal boundaries between the memory cell regions 1. In such a case, the covering portions 3 of the resist pattern will be shaped as illustrated in FIG. 5, since the influence of diffraction at a corner portion 21 where the slit 2 and a vertical side of the covering portion 20 intersect each other is less than that at other portions (i.e., a shaded region is created at the corner portion 21).

Figure 6:
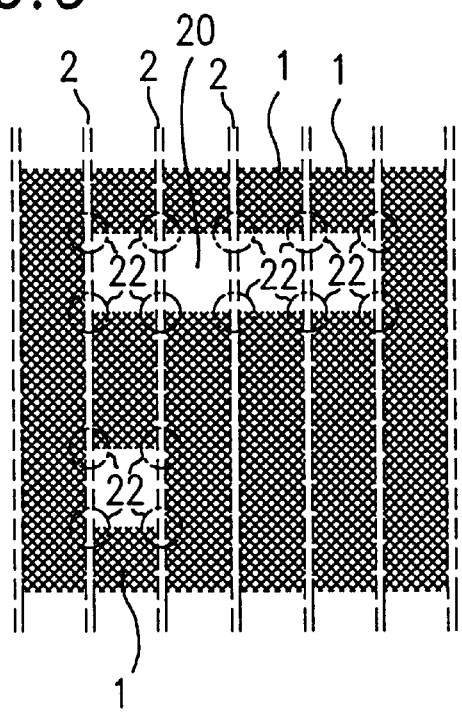
FIG. 6 is a plan view of a photomask according Example 3 of the present invention.
Figure 7:
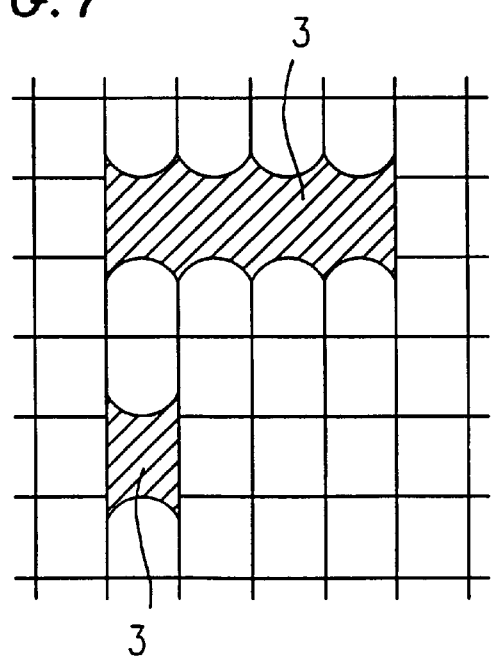
FIG. 7 is a plan view illustrating a resist pattern projected by the photomask of FIG. 6, partially in an exaggerated manner.

FIG. 6 is a photomask according to Example 3 of the present invention. In Example 3, the slits 2 are provided only along the vertical boundaries between the memory cells 1. In such a case, the covering portions 3 of the resist pattern will be shaped as illustrated in FIG. 7, since the influence of diffraction at a portion 22 where the slit 2 and an upper or lower side of the covering portion 20 intersect each other is less than that at other portions (i.e., a shaded region is created at the portion 22).

Figure 8:
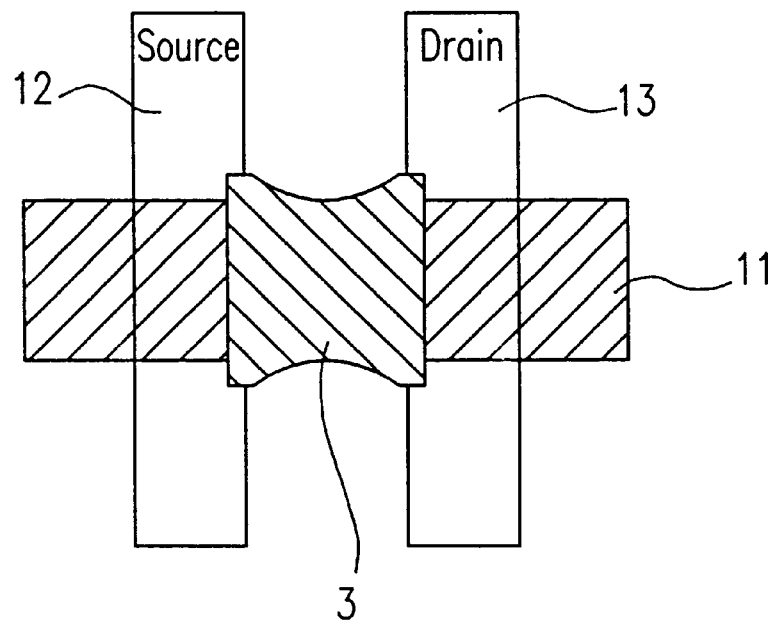
FIG. 8 is an enlarged plan view illustrating a covering portion of the resist pattern of FIG. 7 and a portion of a memory cell.

FIG. 8 illustrates in an enlarged view the covering portion 3 of the resist pattern and a portion of a memory cell. Each memory cell has an MOS type transistor including a gate electrode 11, a source electrode 12 and a drain electrode 13. For each horizontal row of the matrix arrangement of the memory cells, the gate electrodes 11 of the memory cells are commonly connected to a horizontal line (not shown). For each vertical column, the source electrodes 12 of the memory cells are commonly connected to a vertical line (not shown) while the drain electrodes 13 are commonly connected to another vertical line. An output signal can be obtained from a desired memory cell through one of the lines that are connected to the source electrodes 12 of the memory cells by selectively controlling the respective voltages of the lines which are connected to the gate electrodes 11 of the memory cells and the respective voltages of the lines which are connected to the drain electrodes 13 of the memory cells.

As is apparent from FIG. 8, the vertical edges of the covering portion 3 are both straight, whereby slight deformation, slight narrowing, slight misalignment, and the like, of the covering portion 3 will not cause the source 12 and the drain 13 to extend beyond the covering portion 3, and any impurity implantation into a channel between the source 12 and the drain 13 will not influence the source 12 and the drain 13.

Moreover, even if the horizontal edge of the covering portion 3 is displaced off the channel so that an impurity is implanted into a region which is vertically off the channel, it will only slightly change the width of the channel and will not be a fatal defect of the MOS type transistor.

Figure 9:
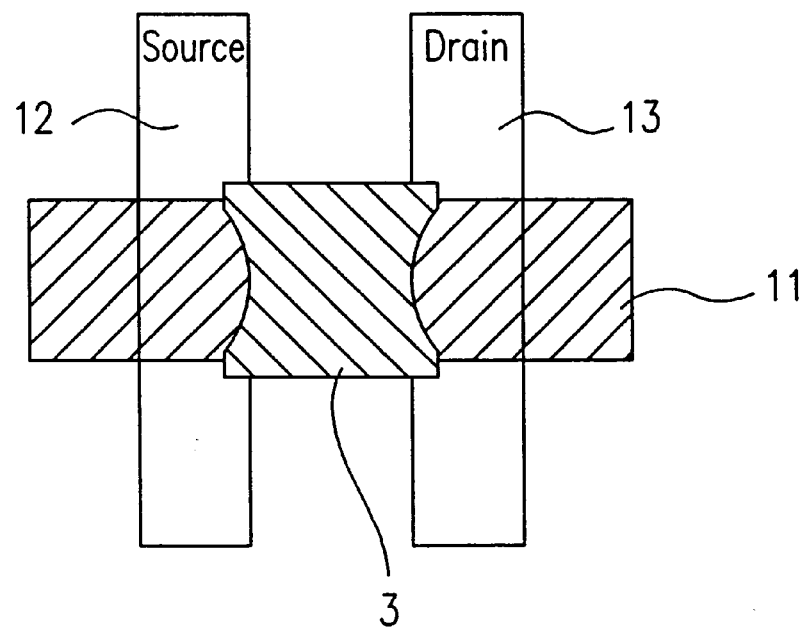
FIG. 9 is an enlarged plan view illustrating a covering portion of the resist pattern of FIG. 5 and a portion of the memory cell as that shown in FIG. 8.
Figure 10:
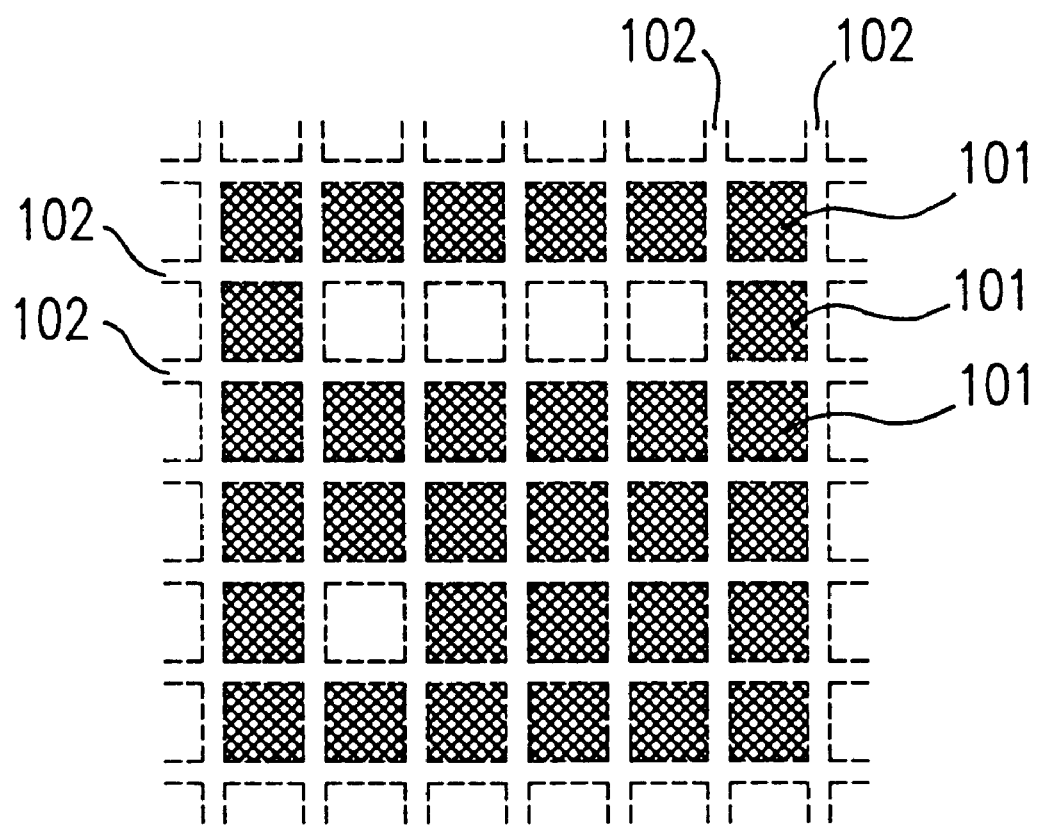
FIG. 10 is a plan view illustrating an example of a conventional photomask.
Figure 11:
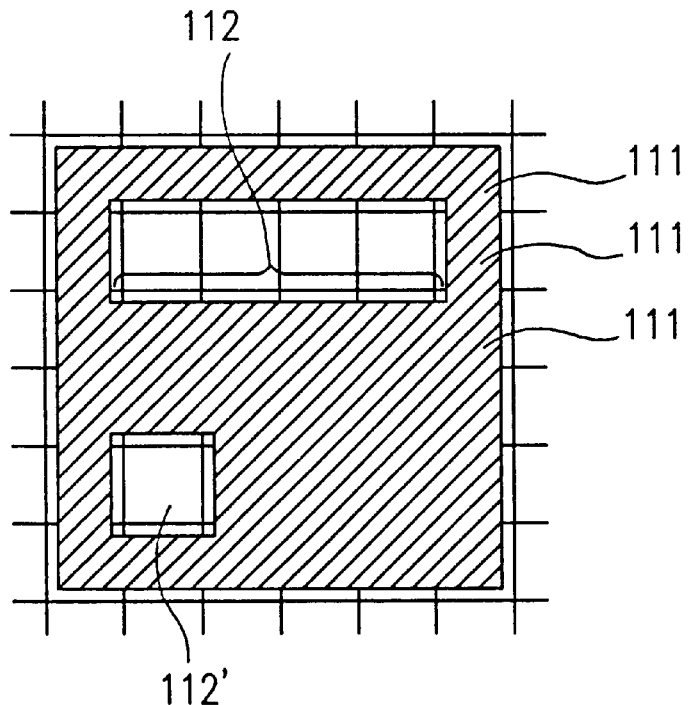
FIG. 11 is a plan view illustrating another example of a conventional photomask.
Figure 12:
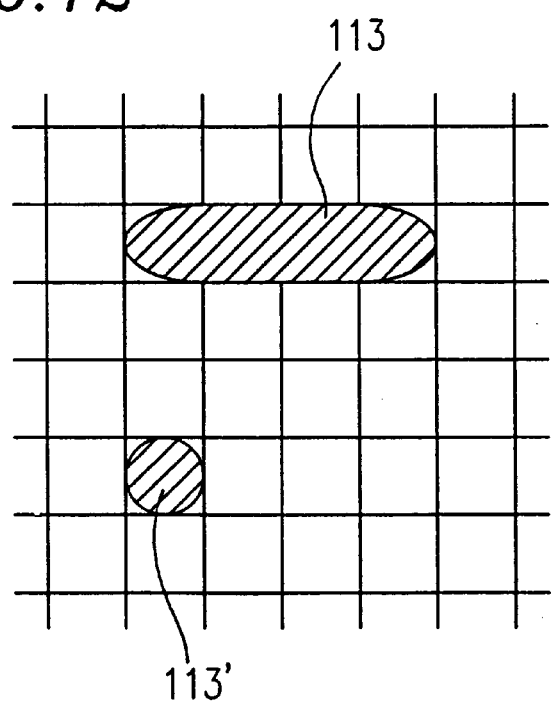
FIG. 12 is a plan view illustrating a resist pattern projected by the photomask of FIG. 11.
Figure 13:
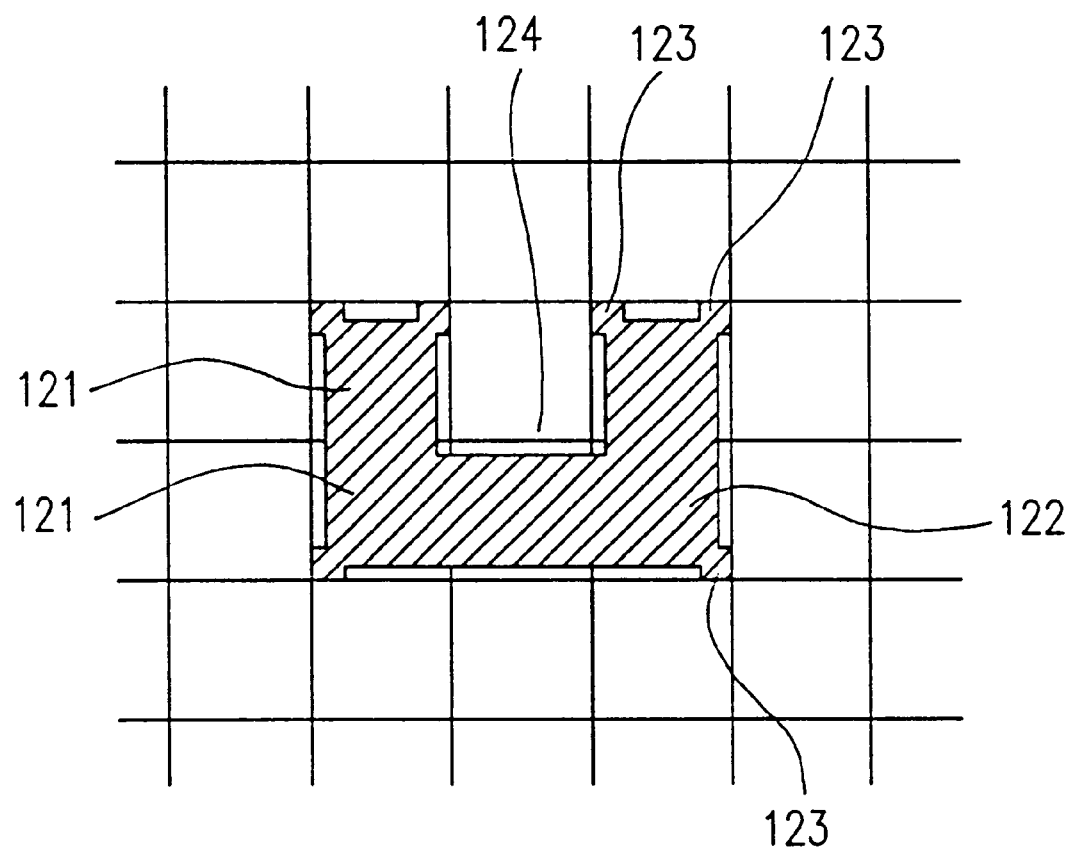
FIG. 13 is a plan view illustrating still another example of a conventional photomask.

FIG. 9 illustrates a portion of the memory cell as shown in FIG. 8 with a covering portion 3 of the resist pattern of FIG. 5 being provided thereto. As is apparent from FIG. 9, since the vertical edges of the covering portion 3 is curved, even a slight deformation, slight narrowing, slight misalignment, and the like, of the covering portion 3 will cause the source 12 and the drain 13 to extend beyond the covering portion 3, and the impurity to be implanted into a channel will also be implanted into the source 12 and the drain 13, thereby changing the threshold value of the MOS type transistor and causing a defect.

As described above, according to the present invention, since the light blocking slits are provided in the photomask so as to correspond to the boundaries between the memory cells, light leaking out of the memory cells does not reach other memory cells beyond the slits. Since the width of the slit is so small that it is not projected on the resist, portions corresponding to the slits will not appear or remain on the resist pattern, whereby a flaw or defect is not caused by the stripping of the portions of the resist pattern that correspond to the slits.

Moreover, since the slit is so narrow that portions corresponding to the slits will not appear or remain on the resist pattern, it is possible to increase the density of memory cells and to downsize a mask ROM.

Moreover, the slits are each provided between memory cells and define the corners of the memory cell regions, thereby functioning to amend the shape of the corners of the resist pattern that correspond to the corners of the memory cells, so that the corners will not be rounded off.

Furthermore, since the above is realized only by narrowing the slits, it neither increases the amount of information to represent the photomask pattern nor requires fine processing. Thus, it does not increase the cost of a photomask or a mask ROM.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photomask for providing a pattern to a resist applied on a substrate, the photomask comprising:

a light blocking region forming a boundary between a first region and a second region on the substrate, wherein a width of the light blocking region is such that the light blocking region is not projected on the resist when the resist is irradiated through the photomask.

2. A photomask according to claim 1, wherein the light blocking region includes a straight portion.

3. A photomask according to claim 1, wherein the first region is a first memory cell, and the second region is a second memory cell.

4. A photomask according to claim 3, wherein a direction in which the light blocking region extends is substantially identical to a direction in which a line transmitting a signal output from at least one of the first memory cell and the second memory cell extends.

5. A photomask according to claim 3, wherein:

the first memory cell includes a drain, a source and a gate, while the second memory cell also includes a drain, a source and a gate; and a direction in which the light blocking region extends is substantially identical to a direction of a straight line passing through the drain of the first memory cell and the drain of the second memory cell.

6. A photomask according to claim 3, wherein:

the first memory cell includes a drain, a source and a gate, while the second memory cell also includes a drain, a source and a gate; and a direction in which the light blocking region extends is substantially identical to a direction of a straight line passing through the source of the first memory cell and the source of the second memory cell.

7. A photomask according to claim 3, wherein:

the first memory cell includes a drain, a source and a gate, while the second memory cell also includes a drain, a source and a gate; and a direction in which the light blocking region extends is substantially identical to a direction of a straight line passing through the gate of the first memory cell and the gate of the second memory cell.

8. A photomask according to claim 3, wherein a drain, a source and a gate of the first memory cell are arranged in a straight line respectively with a drain, a source and a gate of the second memory cell.

9. A method for producing a semiconductor device, comprising the steps of:

applying a resist on a substrate;

preparing the photomask of claim 1;

irradiating the resist through the photomask with a beam so as to provide the resist with a pattern.

10. A method for producing a semiconductor device, comprising the steps of:

applying a resist on a substrate;

preparing the photomask of claim 3;

irradiating the resist through the photomask with a beam so as to provide the resist with a pattern.

11. A method for producing a mask ROM, comprising the steps of:

applying a resist on a substrate;

preparing the photomask of claim 3;

irradiating the resist through the photomask with a beam so as to provide the resist with a pattern.

12. A method for producing a photomask for providing a pattern to a resist applied on a substrate, the method comprising the step of:

forming a light blocking region which forms a boundary on the substrate between a first region and a second region, wherein a width of the light blocking region is such that the light blocking region is not projected on the resist when the resist is irradiated through the photomask.

* * * * *